(12) United States Patent
Chae (10) Patent No.: US 9,722,009 B2
(45) Date of Patent: Aug. 1, 2017

(54) PAD ELECTRODE STRUCTURE, FLAT DISPLAY APPARATUS COMPRISING THE PAD ELECTRODE STRUCTURE, AND THE METHOD OF MANUFACTURING THE FLAT DISPLAY APPARATUS

(71) Applicant: SAMSUNG DISPLAY CO., LTD., Yongin, Gyeonggi-Do (KR)

(72) Inventor: Jongwon Chae, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 167 days.

(21) Appl. No.: 14/681,034

(22) Filed: Apr. 7, 2015

(65) Prior Publication Data
US 2016/0105959 A1 Apr. 14, 2016

(30) Foreign Application Priority Data
Oct. 13, 2014 (KR) .......................... 10-2014-0137852

(51) Int. Cl.
H05K 7/10 (2006.01)
H05K 7/12 (2006.01)
H01L 27/32 (2006.01)

(52) U.S. Cl.
CPC ...... H01L 27/3276 (2013.01); H01L 27/3297 (2013.01)

(58) Field of Classification Search
CPC ....................................................... H01L 27/32
See application file for complete search history.

(56) References Cited

U.S. PATENT DOCUMENTS

| | | | | |
|---|---|---|---|---|
| 5,943,597 A | * | 8/1999 | Kleffner | ................. H01L 24/05 257/737 |
| 2002/0139969 A1 | * | 10/2002 | Mimino | .................. H01L 23/66 257/20 |
| 2007/0035239 A1 | * | 2/2007 | Kang | .................. H01L 27/1248 313/504 |
| 2012/0164797 A1 | * | 6/2012 | Lowenthal | .......... H01L 27/3281 438/127 |
| 2013/0026476 A1 | | 1/2013 | Park et al. | |
| 2013/0119392 A1 | | 5/2013 | Park et al. | |
| 2015/0171151 A1 | | 6/2015 | Chae | |
| 2015/0349289 A1 | * | 12/2015 | Yu | .......................... H01L 27/32 362/97.1 |

FOREIGN PATENT DOCUMENTS

| KR | 10-2007-0019838 A | 2/2007 |
|---|---|---|
| KR | 10-2013-0013515 A | 2/2013 |
| KR | 10-2013-0053053 A | 5/2013 |
| KR | 10-2007-0056837 A | 6/2013 |
| KR | 10-2015-0070464 | 6/2015 |

* cited by examiner

Primary Examiner — Yuriy Semenenko
(74) Attorney, Agent, or Firm — Lewis Roca Rothgerber Christie LLP (57) ABSTRACT

A pad electrode structure including a substrate, an insulating layer on the substrate, a pad electrode on a portion of the insulating layer, and an organic insulating layer on the pad electrode and having an opening exposing an upper surface of the pad electrode, wherein an insertion area is in the insulating layer near the substrate, and wherein the organic insulating layer is separated from an end portion of the substrate, and a portion of the organic insulating layer is in the insertion area.

18 Claims, 10 Drawing Sheets

PAD ELECTRODE STRUCTURE, FLAT DISPLAY APPARATUS COMPRISING THE PAD ELECTRODE STRUCTURE, AND THE METHOD OF MANUFACTURING THE FLAT DISPLAY APPARATUS

CROSS-REFERENCE TO RELATED APPLICATION

This application claims priority to and the benefit of Korean Patent Application No. 10-2014-0137852, filed on Oct. 13, 2014, in the Korean Intellectual Property Office, the disclosure of which is incorporated herein in its entirety by reference.

BACKGROUND

1. Field

One or more embodiments of the present invention relate to a pad electrode structure, a flat display apparatus including the pad electrode structure, and a method of manufacturing the flat display apparatus.

2. Description of the Related Art

In general, a flat display apparatus such as an organic light-emitting display including thin film transistors (TFTs) and a liquid crystal display may be included in a display device of a mobile device, for example, a smart phone, a tablet personal computer, an ultra-thin laptop, a digital camera, a camcorder, and a personal digital assistant (PDA), or a display device such as an ultra-thin television. Thus, much research has been conducted to develop high performance flat display apparatuses.

SUMMARY

Aspects of one or more exemplary embodiments of the present invention are directed toward a pad electrode structure having good reliability, a flat display apparatus including the pad electrode structure, and a method of manufacturing the flat display apparatus.

Additional aspects will be set forth in part in the description which follows and, in part, will be apparent from the description, or may be learned by practice of the presented embodiments.

According to one or more exemplary embodiments of the present invention, there is provided a pad electrode structure including: a substrate; an insulating layer on the substrate; a pad electrode on a portion of the insulating layer; and an organic insulating layer on the pad electrode and having an opening exposing an upper surface of the pad electrode, wherein an insertion area is in the insulating layer near the substrate, and wherein the organic insulating layer is separated from an end portion of the substrate, and a portion of the organic insulating layer is in the insertion area.

In an embodiment, the organic insulating layer includes a first area on the pad electrode, a second area on the insulating layer, and a third area in the insertion area.

In an embodiment, a minimum height of the third area with respect to an upper surface of the insulating layer is smaller than a minimum height of the second area with respect to an upper surface of the insulating layer.

In an embodiment, a gradient of the third area with respect to an upper surface of the insulating layer is greater than a gradient of the second area with respect to an upper surface of the insulating layer.

In an embodiment, a depth of the insertion area is less than or equal to a thickness of the insulating layer.

In an embodiment, the insulating layer includes an inorganic insulating material different from a material of the organic insulating layer.

In an embodiment, the pad electrode structure further includes: a main conductive bonding layer filling the opening of the organic insulating layer; and a dummy conductive bonding layer contacting the organic insulating layer and the insulating layer.

In an embodiment, the pad electrode structure further includes a printed circuit board contacting the main conductive bonding layer.

According to one or more exemplary embodiments of the present invention, there is provided a flat display apparatus including: a plurality of pixels; and a pad electrode structure electrically connected to the plurality of pixels, wherein the pad electrode structure includes: a substrate; an insulating layer on the substrate; a pad electrode on a portion of the insulating layer; and an organic insulating layer on the pad electrode and having an opening exposing an upper surface of the pad electrode, wherein an insertion area is in the insulating layer near the substrate, and wherein the organic insulating layer is separated from an end portion of the substrate, and a portion of the organic insulating layer is in the insertion area.

In an embodiment, the organic insulating layer includes a first area on the pad electrode, a second area on the insulating layer, and a third area in the insertion area.

In an embodiment, a minimum height of the third area with respect to an upper surface of the insulating layer is less than a minimum height of the second area with respect to an upper surface of the insulating layer.

In an embodiment, a gradient of the third area with respect to an upper surface of the insulating layer is greater than a gradient of the second area with respect to an upper surface of the insulating layer.

In an embodiment, a depth of the insertion area is less than or equal to a thickness of the insulating layer.

In an embodiment, the insulating layer includes an inorganic insulating material different from a material of the organic insulating layer.

In an embodiment the flat display apparatus further includes: a main conductive bonding layer filling the opening of the organic insulating layer; and a dummy conductive bonding layer contacting the organic insulating layer and the insulating layer.

In an embodiment the flat display apparatus further includes a printed circuit board contacting the main conductive bonding layer.

According to one or more exemplary embodiments of the present invention, there is provided a method of manufacturing a flat display apparatus, the method including: forming an insulating layer on a substrate; forming an insertion area in the insulating layer, the insertion area being formed toward the substrate, and forming a pad electrode on the insulating layer; and forming an organic insulating layer to expose a portion of the pad electrode and a portion of the insulating layer, wherein, in the forming of the organic insulating layer, at least a portion of the organic insulating layer fills the insertion area.

In an embodiment, the method further includes spreading a conductive bonding material on the opening and arranging a printed circuit board (PCB) to contact the conductive bonding material, wherein, in the arranging of the PCB, the conductive bonding material is pressed by the PCB, thereby forming a main conductive bonding layer in the opening, and a dummy conductive bonding layer, the dummy conductive bonding layer contacting the insulating layer and the organic insulating layer.

BRIEF DESCRIPTION OF THE DRAWINGS

These and/or other aspects will become apparent and more readily appreciated from the following description of the exemplary embodiments, taken in conjunction with the accompanying drawings in which:

FIGS. 8A to 9 are modified embodiments of an insertion area of a pad electrode structure, according to an exemplary embodiment of the present invention.

DETAILED DESCRIPTION

As the present invention allows for various suitable changes and numerous embodiments, particular embodiments will be illustrated in the drawings and described in detail in the written description. The attached drawings for illustrating example embodiments of the present invention are referred to in order to gain a sufficient understanding of the present invention, the merits thereof, and the features accomplished by the implementation of the present invention. The present invention may, however, be embodied in many different forms and should not be construed as being limited to the embodiments set forth herein.

Hereinafter, the present invention will be described in detail by explaining example embodiments of the invention in reference to the attached drawings. Like reference numerals in the drawings denote like elements, and thus their description may not be provided.

It will be understood that although the terms "first", "second", etc. may be used herein to describe various suitable components, these components should not be limited by these terms. These components are only used to distinguish one component from another.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Sizes of components in the drawings may be exaggerated for convenience of explanation. In other words, because sizes and thicknesses of components in the drawings are arbitrarily illustrated for convenience of explanation, the following embodiments are not limited thereto.

Figure 1:
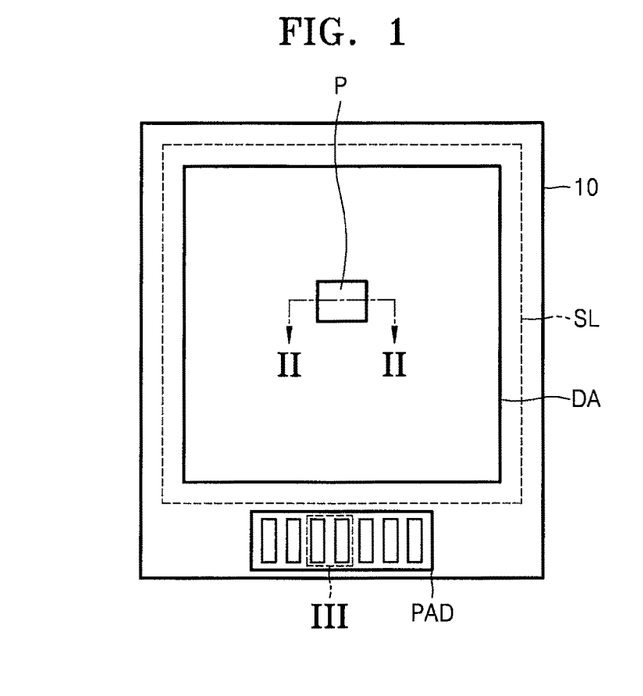
FIG. 1 is a schematic plan view of a flat display apparatus according to an exemplary embodiment of the present invention.

FIG. 1 is a schematic plan view of a flat display apparatus according to an exemplary embodiment of the present invention.

Referring to FIG. 1, a substrate 10 of the flat display apparatus includes a display area DA, which includes multiple pixels P and displays an image, and a pad PAD, which is configured to receive electrical signals from the outside. The display area DA is formed within an area surrounded by a sealing line SL, and an encapsulation member, which encapsulates the display area DA, may be formed along the sealing line SL. The pad PAD, which is electrically connected to a pixel P and is connected to a printed circuit board (PCB), may be formed on an outer region of the display area DA.

Figure 2:
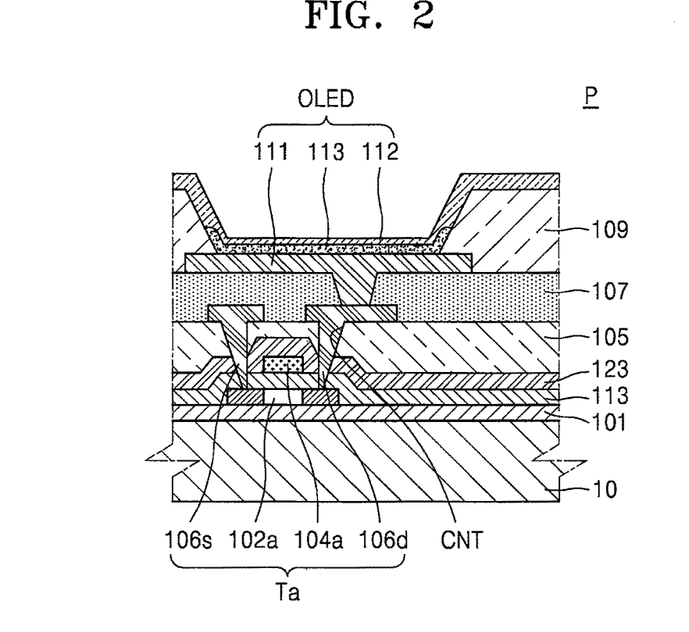
FIG. 2 is a cross-sectional view taken along the line II-II of FIG. 1 for illustrating a pixel of the flat display apparatus, according to an exemplary embodiment of the present invention.

FIG. 2 is a cross-sectional view taken along the line II-II of FIG. 1 and illustrates the pixel P of the flat display apparatus, according to an exemplary embodiment of the present invention. FIG. 2 shows a thin film transistor (TFT) Ta and an organic light-emitting device (OLED) included in the pixel P, but may further include an additional TFT and a capacitor. In FIG. 2, the OLED is illustrated as a flat display apparatus, but the present exemplary embodiment is not limited thereto. The flat display apparatus may be, for example, a liquid crystal display apparatus.

Referring to FIG. 2, the pixel P is formed on the substrate 10. The substrate 10 may be a glass substrate. However, a material of the substrate 10 is not limited thereto, and any material used to form a substrate for a flat display apparatus may be properly selected as desired and/or needed.

A buffer layer 101, which provides a flat surface on the substrate 10 and includes insulating materials to prevent or substantially prevent moisture and impurities from penetrating the substrate 10, may be formed on the substrate 10.

A pixel circuit that includes the TFT Ta and a capacitor, and the OLED, which is connected to the pixel circuit, are formed on the buffer layer 101. The TFT Ta roughly includes an active layer 102a, a gate electrode 104a, source/drain electrodes 106s and 106d. While only one pixel circuit has been shown, embodiments of the present invention are not limited thereto and may include a plurality of pixel circuits, as understood by one of ordinary skill in the art.

The active layer 102a, which has a pattern (e.g., a predetermined pattern), is arranged on an upper surface of the buffer layer 101. The active layer 102a may contain inorganic semiconductor materials such as silicon, organic semiconductor materials, or oxide semiconductor materials, which include oxides, such as indium (In), gallium (Ga), tin (Sn), hafnium (Hf), and zinc (Zn). Also, as desired and/or needed, P-type or N-type dopants may be injected into the active layer 102a. A first gate insulating layer 113 is formed on an upper surface of the active layer 102a. The first gate electrode 104a is formed on an upper surface of the first gate insulating layer 113 so as to correspond to the active layer 102a. A second gate insulating layer 123 and an interlayer insulating layer 105 are formed to cover the first gate electrode 104a, and the source/drain electrodes 106s and 106d are formed on an upper surface of the interlayer insulating layer 105. The source/drain electrodes 106s and 106d contact an area (e.g., a predetermined area) of the active layer 102a via a contact opening (e.g., a contact hole) CNT.

A planarization layer 107 is formed to cover the source/drain electrodes 106s and 106d of the TFT Ta.

The OLED is formed on an upper surface of the planarization layer 107. The OLED includes a first electrode 111, a second electrode 112, and an intermediate layer 113.

The first electrode 111 is formed on the planarization layer 107. The first electrode 111 is formed to be electrically connected to any one of the source/drain electrodes 106s and 106d. A pixel-defining layer 109 is formed to cover the first electrode 111. After an opening (e.g., a predetermined opening) is formed in the pixel-defining layer 109, the intermediate layer 113, which includes emission layers, is formed in an area defined by the opening. The second electrode 112 is formed on an upper surface of the intermediate layer 113.

When the OLED is a full-color OLED, the emission layers may be respectively patterned as a red emission layer, a green emission layer, and a blue emission layer according to a red sub-pixel, a green sub-pixel, and a blue sub-pixel.

The emission layers may have a multilayer structure, in which the red emission layer, the green emission layer, and the blue emission layer are stacked, or a single-layer structure, including a red emission material, a green emission material, and a blue emission material, so as to emit white light. The above OLED further includes a red-color filter, a green-color filter, and a blue-color filter, thereby emitting full-color light.

Each pixel P has a transparent-window structure, which may allow external light to pass therethrough, and thus, a transparent display apparatus may be embodied.

Figure 3:
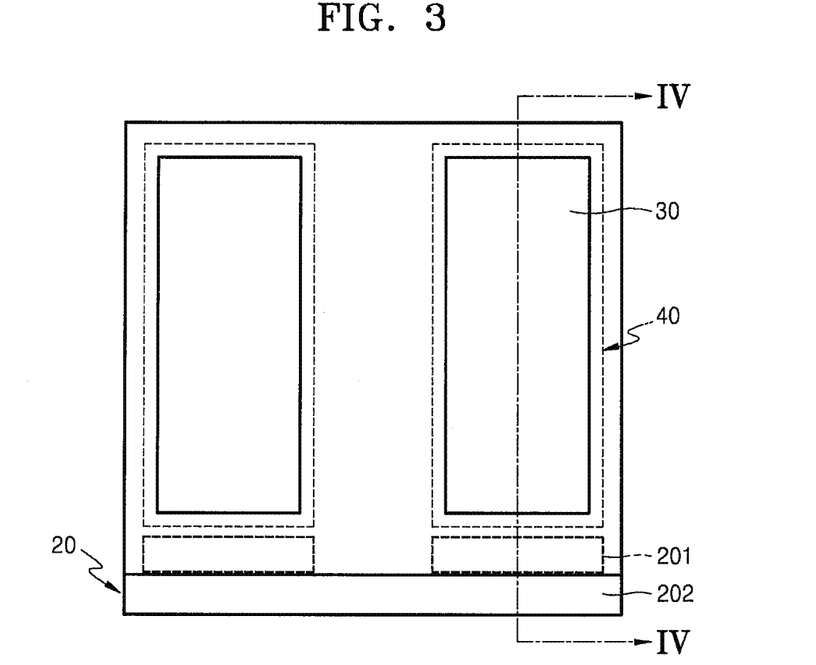
FIG. 3 is an enlarged plan view of an area III of FIG. 1 for schematically illustrating a pad electrode structure of the flat display apparatus, according to an exemplary embodiment of the present invention.
Figure 4:
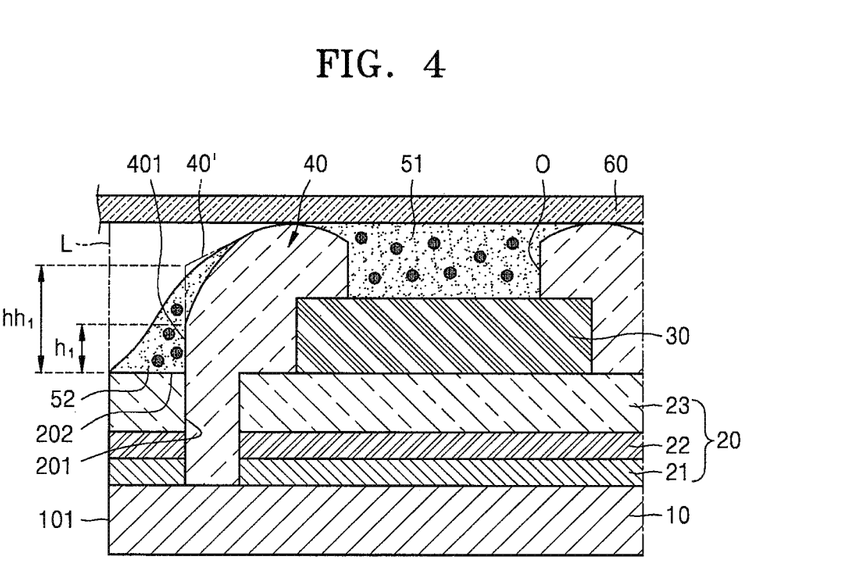
FIG. 4 is a cross-sectional view taken along the line IV-IV of FIG. 3.

FIG. 3 is an enlarged plan view of an area III of FIG. 1 and schematically illustrates a pad electrode structure of the flat display apparatus, according to an exemplary embodiment of the present invention. FIG. 4 is a cross-sectional view taken along the line IV-IV of FIG. 3. In FIG. 3, conductive bonding layers 51 and 52 and a printed circuit board (PCB) 60 are not shown for convenience.

Referring to FIGS. 3 and 4, the pad electrode structure includes the substrate 10, an insulating layer 20, a pad electrode 30, and an organic insulating layer 40.

The substrate 10 may be a glass substrate. However, a material of the substrate 10 is not limited thereto, and any material used to form a substrate for a flat display apparatus may be properly selected as desired and/or needed.

The insulating layer 20 is formed on the substrate 10. The insulating layer 20 provides a flat surface on the substrate 10 and may block the penetration of impurities thereinto.

The insulating layer 20 may include inorganic insulating materials. For example, the insulating layer 20 includes inorganic insulating materials such as silicon nitride, silicon oxide, and/or other suitable materials. The insulating layer 20 may be easily cut due to properties of the materials.

The insulating layer 20 may be a single layer or a multilayer. For example, the insulating layer 20 may include a first insulating layer 21, a second insulating layer 22, and a third insulating layer 23.

Each of the first insulating layer 21, the second insulating layer 22, and the third insulating layer 23 may be a single layer or a multilayer. For example, the first insulating layer 21 may be a bilayer including a silicon nitride layer having a thickness of about 40 nm and a silicon oxide layer having a thickness of about 100 nm. The second insulating layer 22 may be a silicon nitride layer having a thickness of about 120 nm. The third insulating layer 23 may be a silicon oxide layer having a thickness of about 300 nm.

The insulating layer 20 may be formed of the same or substantially the same material as in at least one of the interlayer insulating layer 105 used in the display area DA, the first gate insulating layer 113, and the second insulating layer 123. For example, the first insulating layer 21 may be formed of the same or substantially the same material as that forming the first gate insulating layer 113. The second insulating layer 22 may be formed of the same or substantially the same material as that forming the second gate insulating layer 123. The third insulating layer 23 may be formed of the same or substantially the same material as that forming the interlayer insulating layer 105. Accordingly, the insulating layer 20 may be concurrently (e.g., simultaneously) formed with the interlayer insulating layer 105, the first gate insulating layer 113, and the second insulating layer 123 while the pixels P of the display area DA are formed.

The pad electrode 30 is formed on a portion of the upper surface of the insulating layer 20. The pad electrode 30 may be a single layer or multilayer formed of conductive metals having low resistance. The pad electrode 30 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or the like. For example, the pad electrode 30 may have a trilayer in which a Ti layer, an Al layer, and a Ti layer are stacked, and a thickness of the pad electrode 30 may be about 500 nm.

Materials of the pad electrode 30 may be the same or substantially the same as in the source electrode 106s and the drain electrode 106d. Accordingly, the pad electrode 30 may be concurrently (e.g., simultaneously) formed together with the source electrode 106s and the drain electrode 106d while pixels are formed in the display area DA.

The organic insulating layer 40 is formed on the pad electrode 30. An opening O, which exposes an upper surface of the pad electrode 30, is formed in the organic insulating layer 40.

The organic insulating layer 40 includes an organic insulating material. For example, the organic insulating material may include at least one of polyimide-based resin and poly acryl-based resin.

When the planarization layer 107 of the display area DA is formed of an organic insulating material, the organic insulating layer 40 may be formed of the same or substantially the same material as the planarization layer 107. The organic insulating layer 40 may be concurrently (e.g., simultaneously) formed with the planarization layer 107.

The main conductive bonding layer 51 is formed in the opening O, which is formed in the organic insulating layer 40. The main conductive bonding layer 51 contacts the pad electrode 30 and the PCB 60 and electrically connects the same.

The dummy conductive bonding layer 52 is formed on a portion of an upper surface of the insulating layer 20. The dummy conductive bonding layer 52 contacts the insulating layer 20 and the organic insulating layer 40. The dummy conductive bonding layer 52 contacts the upper surface of the insulating layer 20 and a side surface of the organic insulating layer 40. The dummy conductive bonding layer 52 may be formed concurrently with (e.g., simultaneously with) the main conductive bonding layer 51, which will be described later.

The main conductive bonding layer 51 and the dummy conductive bonding layer 52 may be formed of the same or substantially the same material. For example, the main conductive bonding layer 51 and the dummy conductive bonding layer 52 may be an anisotropic conductive film, which includes conductive particles.

The organic insulating layer 40 may be spaced apart from an end portion 101 of the substrate 10. For example, an end portion 401 of the organic insulating layer 40 may be spaced apart from an extension line L of the end portion 101 of the substrate 10. Accordingly, an exposed area 202, where an area adjacent to an end portion of the upper surface of the insulating layer 20 is not covered by the organic insulating layer 40, may be formed. A width of the exposed area 202 may be less than or equal to about 50 µm.

As the organic insulating layer 40 is spaced apart from the end portion 101 of the substrate 10, the organic insulating layer 40 may not be cut together with the substrate 10 and the insulating layer 20 when the substrate 10 and the insulating layer 20 are cut based on the extension line L of the end portion 101 of the substrate 10.

Due to properties of the materials forming the organic insulating layer 40, it may not be easy to cut the organic insulating layer 40 in comparison to the insulating layer 20 and the substrate 10. Therefore, as the organic insulating layer 40 is spaced apart from the end portion 101 of the substrate 101 so as to prevent or substantially prevent the organic insulating layer 40 from being cut, the occurrence of a cutting defect may be lessened (e.g., prevented). Also, separation, which may occur between the organic insulating layer 40 and the insulating layer 20 thereunder while the organic insulating layer 40 is cut, may be reduced (e.g., prevented).

After an organic insulating material is formed on entire surfaces of the insulating layer 20 and the pad electrode 30 so that the organic insulating layer 40 is spaced apart from the end portion 101 of the substrate 10, the organic insulating material, which is formed at a certain distance from the extension line L of the end portion 101 of the substrate 10, may be removed. A step may be generated between the end portion 401 of the organic insulating layer 40 and a surface of the insulating layer 20.

An insertion area 201 directed toward (e.g., near) the substrate 10 may be formed in the insulating layer 20. A portion of the organic insulating layer 40 may be inserted into the insertion area 201. As the organic insulating layer 40 is formed so that a portion of the organic insulating layer 40 is inserted into the insertion area 201, a height h1 of the end portion 401 of the organic insulating layer 40 may be decreased. The height h1 of the end portion 401 of the organic insulating layer 40 may be a height h1 of the step between the organic insulating layer 40 and the upper surface of the insulating layer 20.

When the organic insulating layer 40 is formed without forming the insertion area 201 in the insulating layer 20, an organic insulating layer 40' may have a shape indicated by the dashed line shown in FIG. 4, and a height of a step of the organic insulating layer 40' may be indicated as $hh_1$. The height $hh_1$ of the step of the organic insulating layer 40' is greater than the height h1 of the step of the organic insulating layer 40. That is, as the insertion area 201 is formed in the insulating layer 20, and as a portion of the organic insulating layer 40 is inserted into the insertion area 201, the height h1 of the step of the organic insulating layer 40 may be decreased. Thus, when the height h1 of the step of the organic insulating layer 40 is great, a cavity C (refer to FIG. 5B) formed between the organic insulating layer 40, the insulating layer 20, and the dummy conductive bonding layer 52 may be removed, or a size thereof may be decreased.

FIGS. 5A to 5D illustrate a structure of the organic insulating layer 40' and a pad electrode structure including the same when no insertion area 201 is formed in the insulating layer 20.

Figure 5A:
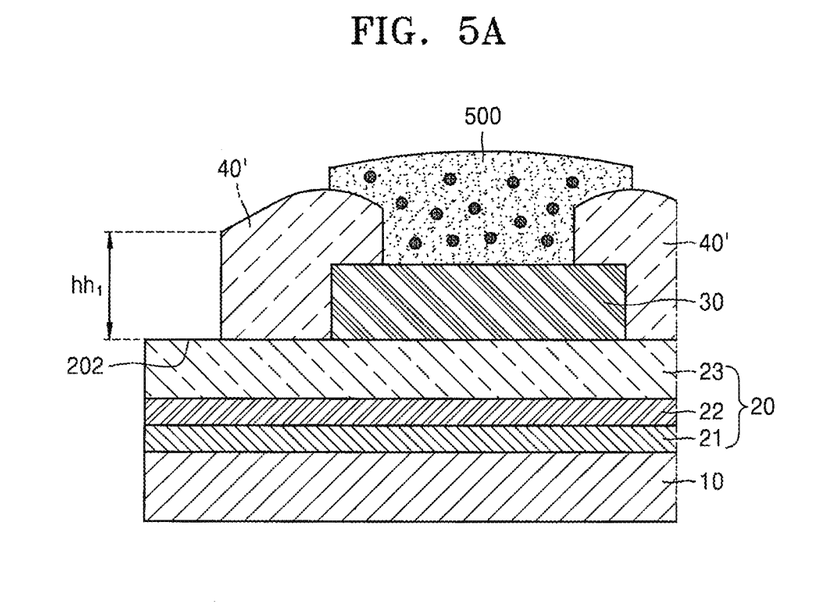
FIGS. 5A to 5D illustrate a structure of an organic insulating layer and a pad electrode structure including the same when an insertion area is not formed in an insulating layer.

Referring to FIG. 5A, the organic insulating layer 40' is formed on the pad electrode 30 and the insulating layer 20 so that the opening O is formed in the organic insulating layer 40'. A conductive bonding material 500 is spread in the opening O formed in the organic insulating layer 40'. In this case, the conductive bonding material 500 having a greater volume than the opening O is spread for contact with the PCB 60.

Figure 5B:
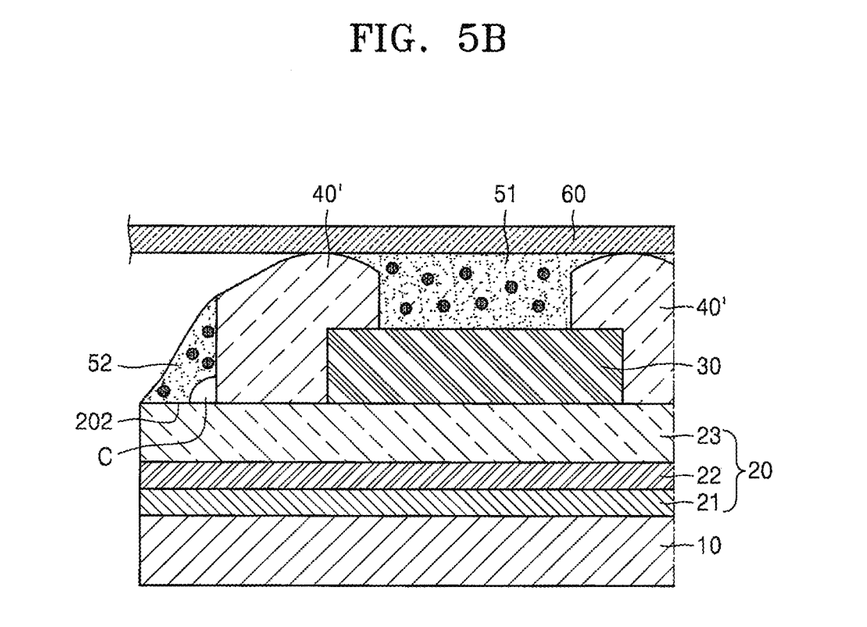

Referring to FIG. 5B, after the PCB 60 is arranged on an upper portion of the conductive bonding material 500, the PCB 60 is pressed to be in contact with the conductive bonding material 500. While the PCB 60 is pressed, some of the conductive bonding material 500 overflows onto the upper surface of the insulating layer 20, thereby forming the dummy conductive bonding layer 52 in contact with the organic insulating layer 40' and the insulating layer 20.

In the structure of FIG. 5B, because the insertion area 201 is not formed in the insulating layer 20, a height of the organic insulating layer 40' is gradually decreased from an upper surface of the pad electrode 30 to the insulating layer 20. In this case, when the exposed area 202 where a portion of the upper surface of the insulating layer 20 is exposed is formed, the organic insulating layer 40' has the height $hh_1$ having a great step (e.g., a relatively great step).

Due to the height $hh_1$ having a great step, the cavity C is formed between the organic insulating layer 40', the insulating layer 20 and the dummy conductive bonding layer 52, while the dummy conductive bonding layer 52 is formed.

When the flat display apparatus is manufactured, a test may be conducted to check the reliability of the flat display apparatus in a high-temperature environment and a low-temperature environment. Thus, the pad electrode structure of the flat display apparatus may be exposed to the high-temperature environment and the low-temperature environment during the test. An example of the high-temperature environment may be an environment at a temperature of about 60 degrees, and an example of the low-temperature environment may be an environment at a temperature of about minus (−) 20 degrees.

When the test is conducted, the cavity C, which is formed between the organic insulating layer 40', the insulating layer 20, and the dummy conductive bonding layer 52, may be a reason that decreases the reliability of the pad electrode structure.

Figure 5C:
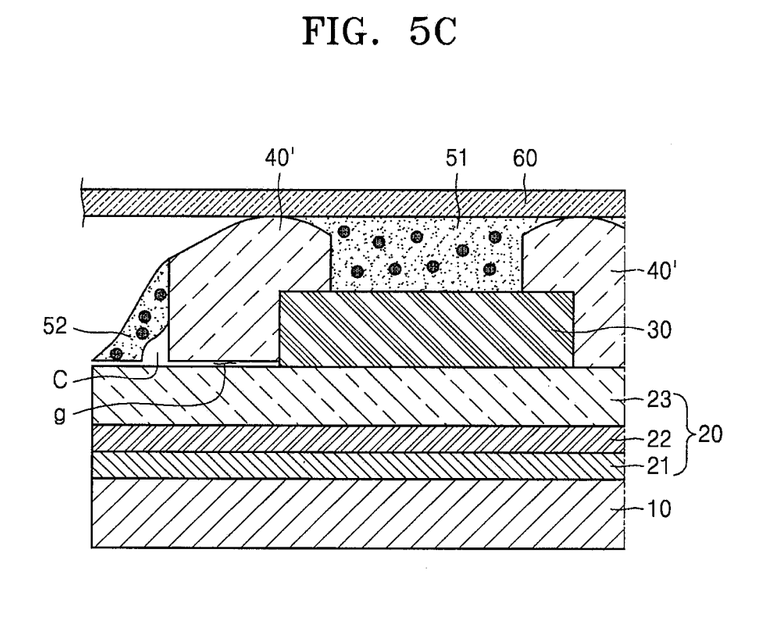

Referring to FIG. 5C, as the pad electrode structure is exposed to the high-temperature environment, the cavity C expands. Further, as the pad electrode structure is exposed to the low-temperature environment, the cavity C contracts (e.g., shrinks or becomes small in size). As the pad electrode structure is repeatedly exposed to the high-temperature environment and the low-temperature environment, the cavity C repeatedly expands and contracts. While the cavity C repeatedly expands and contracts, the dummy conductive bonding layer 52 is separated from the insulating layer 20, and the organic insulating layer 40' is separated from the insulating layer 20. As a result, a gap g is generated between the organic insulating layer 40' and the insulating layer 20.

Figure 5D:
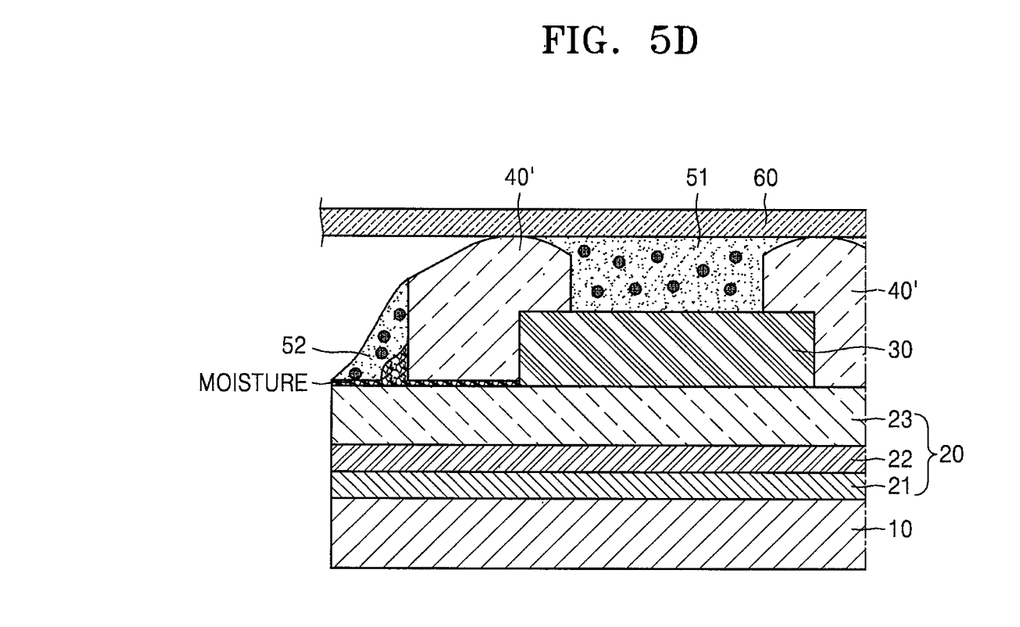

Referring to FIG. 5D, the pad electrode 30 is exposed to the outside through the gap g, and oxygen or moisture may penetrate the pad electrode 30 through the gap g. Thus, the pad electrode 30 may be susceptible to (e.g., weak to) the penetration of moisture.

Figure 6:
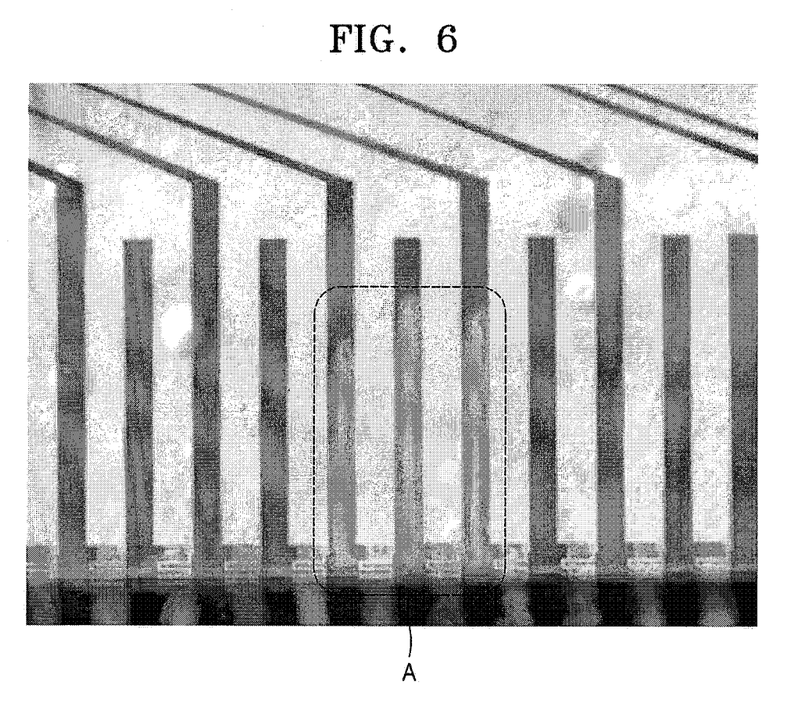
FIG. 6 illustrates exposure of a pad electrode structure including an organic insulating layer not having an insertion area in a high-temperature environment and a low-temperature environment.

FIG. 6 illustrates that the pad electrode structure, in which the organic insulating layer 40' is formed when the insertion area 201 is not formed in the insulating layer 20, is exposed to a high-temperature environment and a low-temperature environment. Referring to an area A of FIG. 6, the area A has portions that are differently colored from other portions. The color difference shows that oxygen or bubbles penetrate along the pad electrode 30.

When the organic insulating layer 40 is formed on the insulating layer 20 without forming the insertion area 201 in the insulating layer 20, the gap g between the organic insulating layer 40 and the insulating layer 20 is generated, and oxygen or moisture may penetrate the pad electrode structure through the gap g.

However, in the present exemplary embodiment, the insertion area 201 is formed in the insulating layer 20, and a portion of the organic insulating layer 40 is inserted into the insertion area 201. Thus, the generation of the gap g between the organic insulating layer 40 and the insulating layer 20 may be mitigated (e.g., prevented).

Referring back to FIG. 4, the insertion area 201 is formed in the insulating layer 20, and a portion of the organic insulating layer 40 is inserted into the insertion area 201. Thus, the height h1 of the step of the organic insulating layer 40 may be decreased. As the height h1 of the step of the organic insulating layer 40 may be decreased, the generation of the cavity C between the insulating layer 20, the organic insulating layer 40, and the dummy conductive bonding layer 52 may be controlled. As the generation of the cavity C is controlled, a problem, which may be caused by the cavity C, that is, the gap g between the organic insulating layer 40 and the insulating layer 20, may be controlled.

Figure 7:
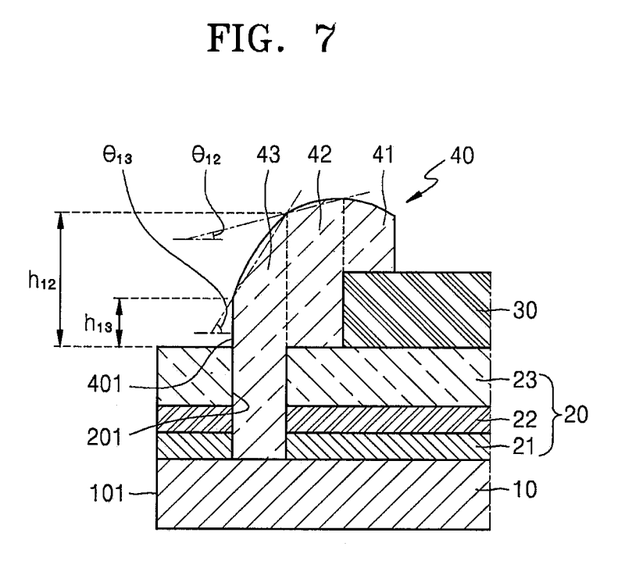
FIG. 7 illustrates an enlarged portion of FIG. 4.

FIG. 7 illustrates an enlarged portion of FIG. 4. Referring to FIGS. 4 and 7, the organic insulating layer 40 includes a first area 41 formed on the pad electrode 30, a second area 42 formed on the insulating layer 20, and a third area 43 formed in the insertion area 201. The second area 42 is located between the first area 41 and the third area 43.

A minimum height h13 of the third area 43 is less than a minimum height h12 of the second area 42. The height is defined with respect to the upper surface of the insulating layer 20, and the minimum height is the smallest height in each area. The minimum height h13 of the third area 43 may be the height h1 of the step of the organic insulating layer 40. The minimum height h13 of the third area 43 may be less than or equal to 1 µm.

A gradient $\theta_{13}$ of the third area 43 may be greater than a gradient $\theta_{12}$ of the second area 42. The gradient of each area defines an angle between an imaginary line, which connects an uppermost portion of an end of each area with an uppermost portion of the other end of each area, and an imaginary line, which is parallel to the upper surface of the insulating layer 20.

As the third area 43 of the organic insulating layer 40 is formed in the insertion area 201 of the insulating layer 20, the gradient $\theta_{13}$ of the third area 43 is substantially decreased compared to the gradient $\theta_{12}$ of the second area 42, and height of the third area 43 is also substantially decreased. Therefore, the height of the step of the organic insulating layer 40 may be reduced (e.g., minimized).

Figure 8A:
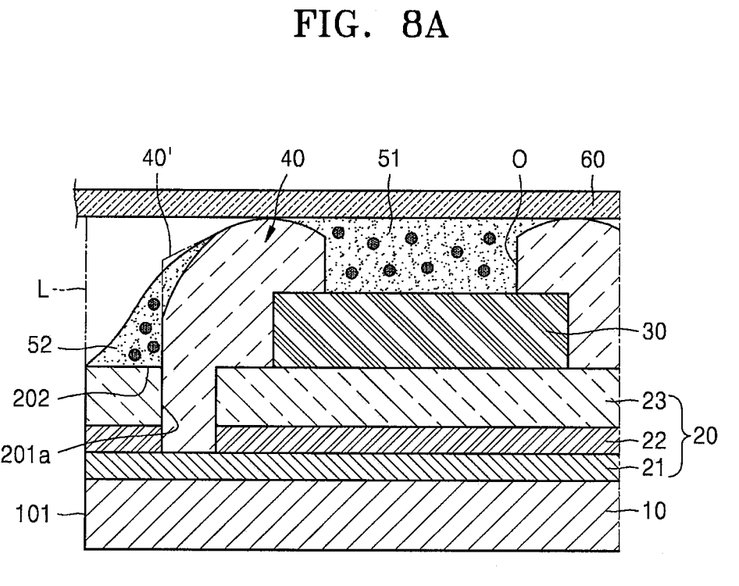
Figure 8B:
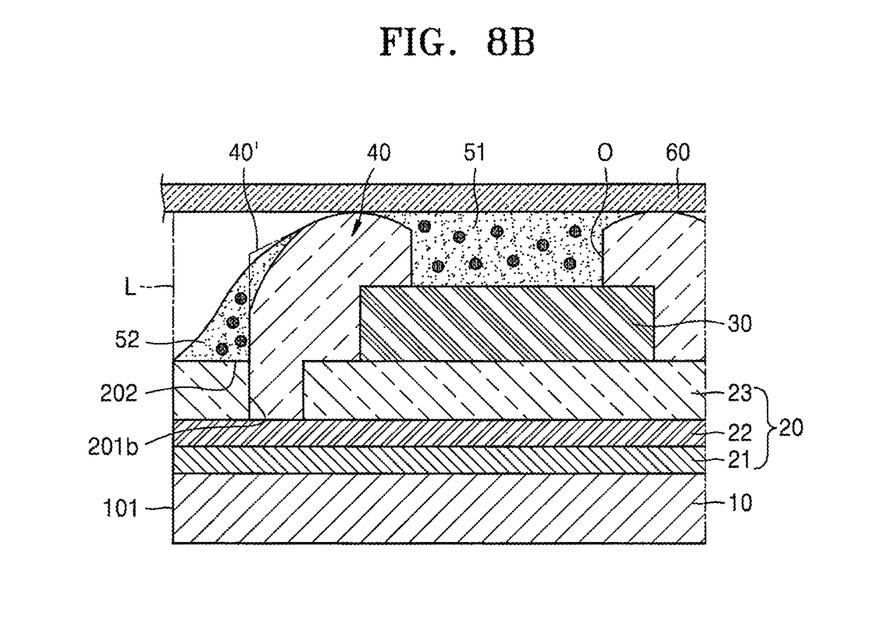

In the above exemplary embodiment, a depth of the insertion area 201 is the same as a thickness of the insulating layer 20. However, the depth of the insertion area 201 is not limited thereto and may be smaller than the thickness of the insulating layer 20. For example, as shown in FIGS. 8A and 8B, depths of insertion areas 201a and 201b may be smaller than the thickness of the insulating layer 20.

Figure 9:
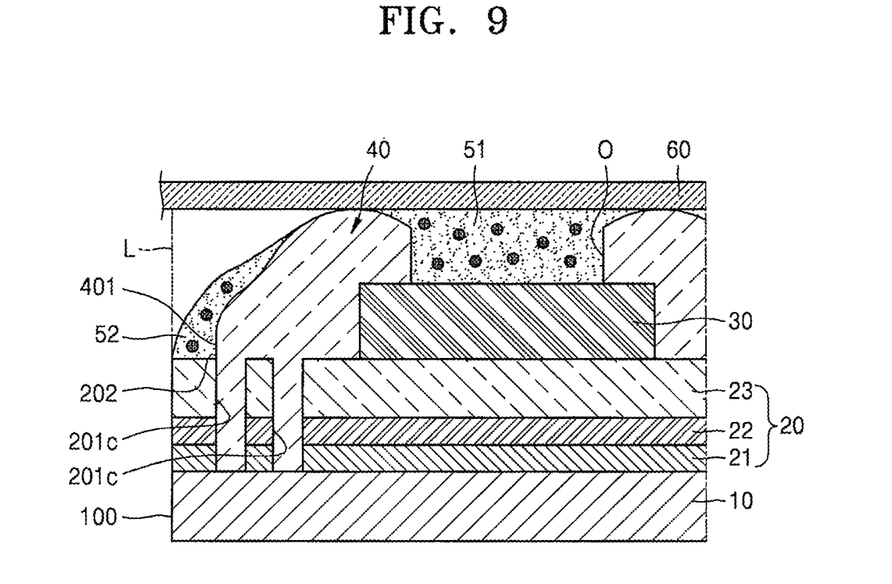

In addition, in the above exemplary embodiment, an example in which one insertion area 201 is formed is described. However, there may be one insertion area or a plurality of insertion areas. As shown in FIG. 9, there may be two insertion areas 201c. Depths of the insertion areas 201c may be the same or substantially the same. As another example, although not illustrated, the depths of the insertion areas 201 may be different from each other.

In the above exemplary embodiments, the organic insulating layer 40 is formed on a lower surface of the insertion area 201, but is not limited thereto. However, although not illustrated, the organic insulating layer 40 may be formed to pass the insertion area 201 but not to pass the exposed area 202. In this case, the organic insulating layer 40 is formed on the insulating layer 20 and may further include an area adjacent to the extension line L of the end portion 101 of the substrate 10.

FIGS. 10A to 10F are schematic diagrams of a method of manufacturing a flat display apparatus according to an exemplary embodiment. FIGS. 10A to 10F mainly illustrate a method of manufacturing a pad electrode structure of the flat display apparatus. Detailed descriptions about a method of manufacturing pixels of a display area may not be provided because a comparable method of manufacturing pixels is used.

Figure 10A:
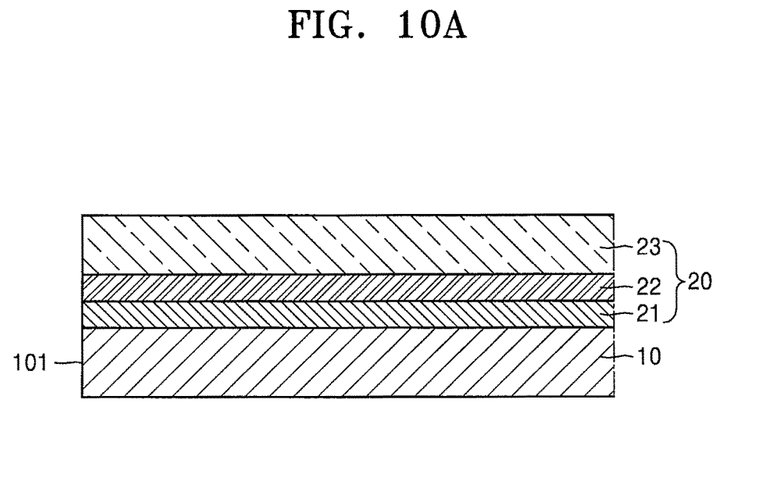
FIGS. 10A to 10F are schematic diagrams of a method of manufacturing a flat display apparatus according to an exemplary embodiment of the present invention.

Referring to FIG. 10A, the insulating layer 20 is formed on the substrate 10. For example, multiple insulating layers 21, 22 and 23 may be sequentially formed on the substrate 10.

The substrate 10 may be a glass substrate. However, a material of the substrate 10 is not limited thereto. When the material is used to form a substrate of the flat display apparatus, the material may be properly selected as desired and/or needed.

The insulating layer 20 may include an inorganic insulating material. For example, the inorganic insulating material may a silicon nitride, a silicon oxide, and/or other suitable materials. The insulating layer 20 may be easily cut due to properties of the material.

The insulating layer 20 may be formed of multiple layers. For example, the insulating layer 20 may include the first insulating layer 21, the second insulating layer 22, and the third insulating layer 23. The first insulating layer 21 may have a bilayer structure in which a silicon nitride layer having a thickness of about 40 nm and a silicon oxide layer having a thickness of about 100 nm are included. The second insulating layer 22 may be a silicon nitride layer having a thickness of about 120 nm. The third insulating layer 23 may have a bilayer structure in which a silicon nitride layer having a thickness of about 200 nm and a silicon oxide layer having a thickness of about 300 nm are included.

The insulating layer 20 may have the same or substantially the same material as at least one of the interlayer insulating layer 105, and first and second gate insulating layers 113 and 123 used in the display area. For example, the first insulating layer 21 may have the same or substantially the same material as the first gate insulating layer 113 used in the display area. The second insulating layer 22 may have the same or substantially the same material as the second gate insulating layer 123 used in the display area. The third insulating layer 23 may have the same or substantially the same material as the interlayer insulating layer 105 used in the display area. Accordingly, the insulating layer 20 may be concurrently (e.g., simultaneously) formed together with the interlayer insulating layer 105 and the first and second gate insulating layers 113 and 123 while the pixels of the display area are formed.

Figure 10B:
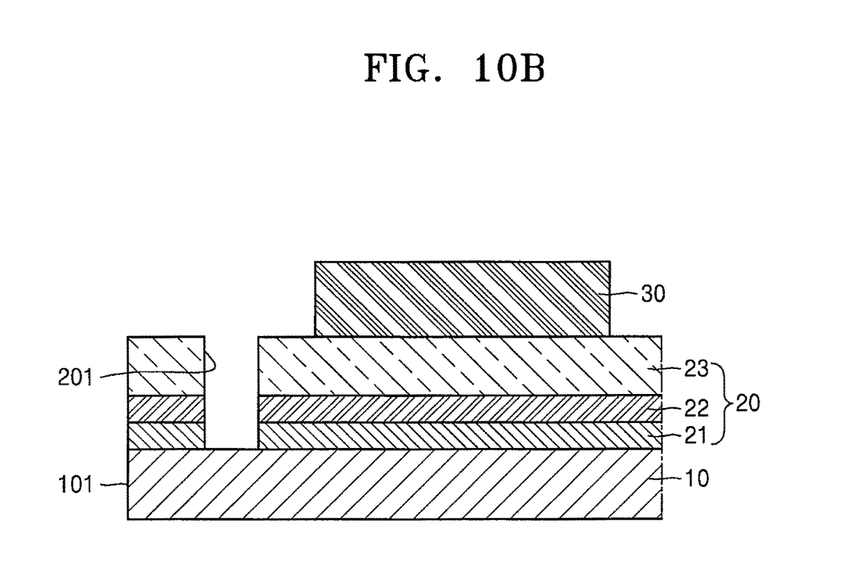

Referring to FIG. 10B, the insertion area 201, which is inserted toward the substrate 10, may be formed in the insulating layer 20. The depth of the insertion area 201 may correspond to the thickness of the insulating layer 20. However, the depth of the insertion area 201 is not limited thereto and may be smaller than the thickness of the insulating layer 20.

When the contact opening (e.g., the contact hole) CNT (refer to FIG. 2) is formed in the display area, the insertion area 201 may be concurrently (e.g., simultaneously) formed together with the contact opening (e.g., the contact hole) CNT. Accordingly, the insertion area 201 may be formed through a comparable process instead of a separate process of forming the insertion area 201.

The pad electrode 30 is formed on a portion of the insulating layer 20. The pad electrode 30 may be a single layer or a multilayer formed of conductive metals having a low resistance. The pad electrode 30 may include Al, Pt, Pd, Ag, Mg, Au, Ni, Nd, Ir, Cr, Li, Ca, Mo, Ti, TW, Cu, and/or the like. Materials of the pad electrode 30 may be the same or substantially the same as those of the source or drain electrodes 106s and 106d used in the display area. For example, the pad electrode 30 may have a trilayer structure in which a Ti layer, an Al layer, and Ti layer are stacked, and a thickness thereof may be about 500 nm.

Figure 10C:
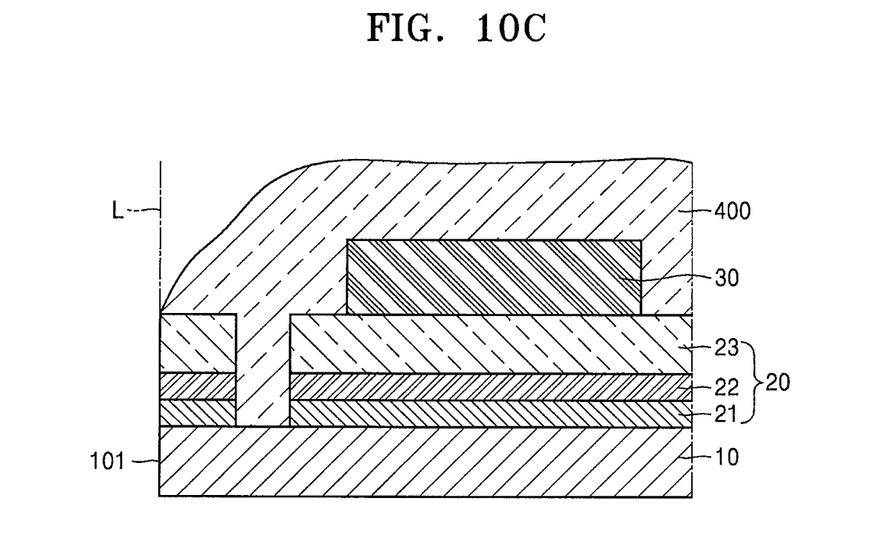

Referring to FIG. 10C, an organic insulating layer 400 may be spread on the insulating layer 20 and the pad electrode 30 so that at least a portion of the organic insulating layer 400 may be inserted into the insertion area 201. The organic insulating layer 400 may be concurrently (e.g., simultaneously) formed together with the planarization layer 107, which is formed in the display area.

Various suitable method of spreading the organic insulating layer 400 may be used. For example, a spin coating method may be used. A height of the organic insulating layer 400 may be gradually decreased in a direction from the pad electrode 30 to the extension line L of the end portion 101 of the substrate 10. As a portion of the organic insulating layer 400 is inserted into the insertion area 201, the height of the organic insulating layer 400 may be substantially decreased in the insertion area 201.

Figure 10D:
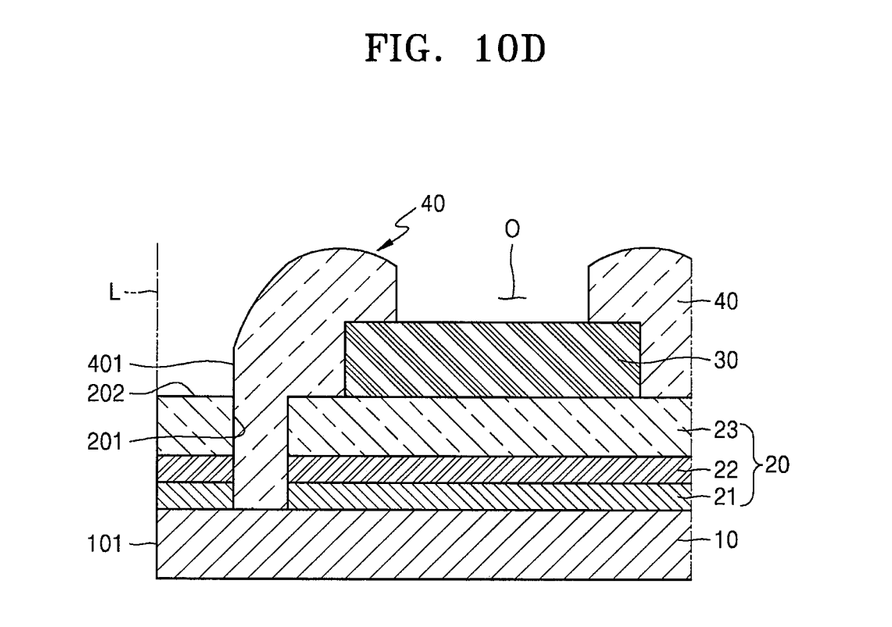

Referring to FIG. 10D, the organic insulating layer 400 is patterned through photolithography using a photo mask, and thus, the above-described organic insulating layer 40 is formed.

A mask process through the photolithography is performed through a developing process, an etching process, and a stripping process or an ashing process after light is emitted toward the photo mask by a light-exposure device.

The organic insulating layer 40 is formed to expose a portion of the pad electrode 30 and a portion of the insulating layer 20. Accordingly, the opening O, which exposes a portion of the pad electrode 30 and the exposed area 202 that exposes a portion of the insulating layer 20, are formed.

Figure 10E:
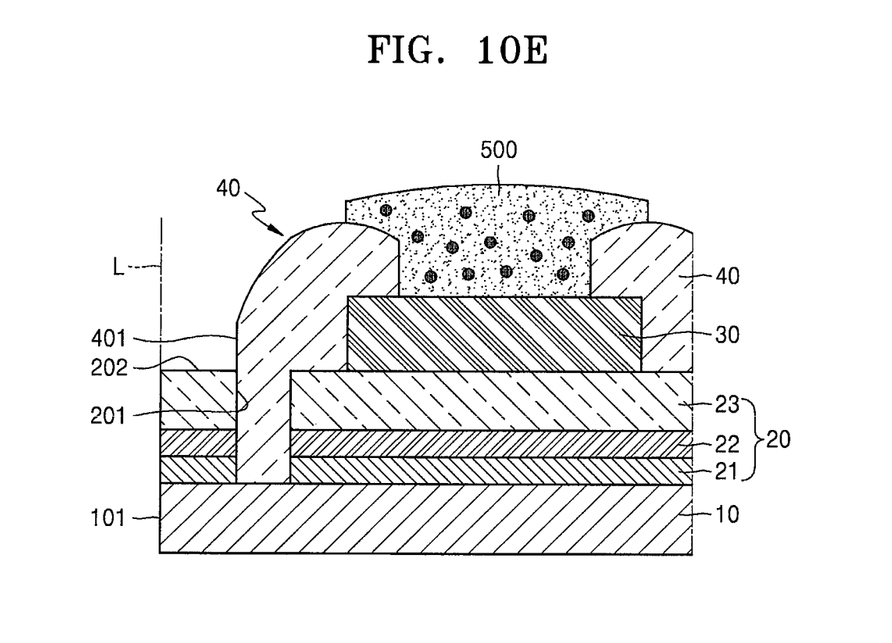

Referring to FIG. 10E, the conductive bonding material 500 is spread in the opening O. A volume of the conductive bonding material 500 may be greater than that of the opening O in order to contact the PCB 60. The conductive bonding material 500 may be an anisotropic conductive film including conductive particles.

Figure 10F:
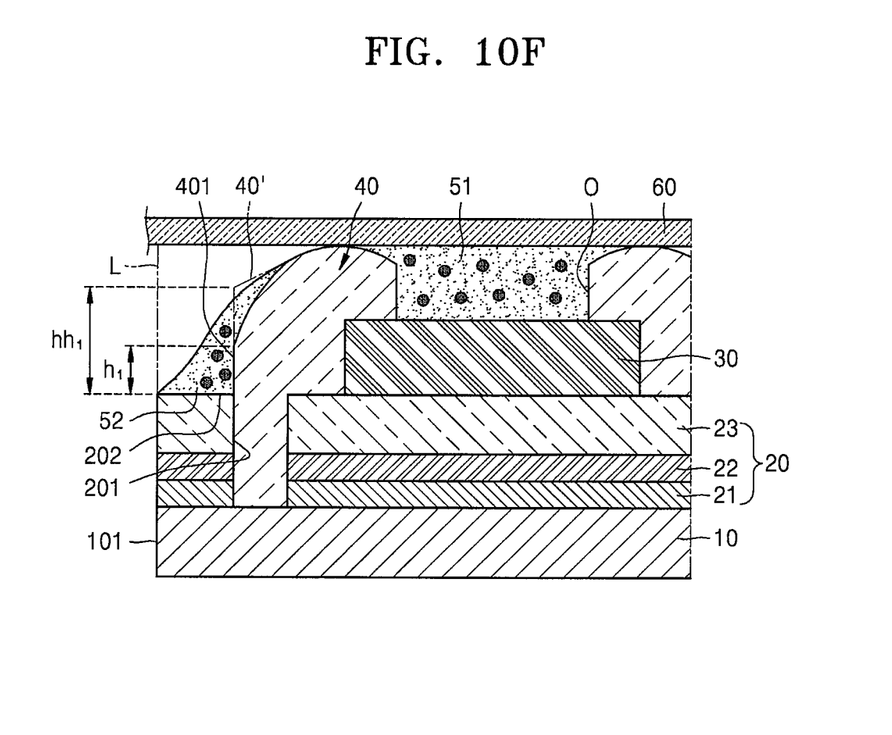

Referring to FIG. 10F, after the PCB 60 is arranged on the conductive bonding material 500, the PCB 60 is pressed to be in contact with the conductive bonding material 500. While the PCB 60 is pressed, some of the conductive bonding material 500 may overflow into the opening O and move to the upper surface of the insulating layer 20. Thus, the main conductive bonding layer 51, which is arranged on the opening O and electrically connects the pad electrode 30 and the PCB 60, and the dummy conductive bonding layer 52 that contacts the organic insulating layer 40 and the insulating layer 20, are formed.

In the present exemplary embodiment, the insertion area 201 is formed in the insulating layer 20, and a portion of the organic insulating layer 40 is inserted into the insertion area 201. Therefore, the height of the step of the organic insulating layer 40 may be decreased. As the height of the step of the organic insulating layer 40 is decreased, a space where the cavity C is formed by the organic insulating layer 40 and the dummy conductive bonding layer 52 contracts (e.g., becomes small in size). Therefore, generation of the cavity C is decreased. Also, although the cavity C is formed, a size of the cavity C is extremely small, and an influence of the cavity C on the pad electrode 30 may be reduced (e.g., minimized) by allowing oxygen or moisture to flow around the insertion area 201.

According to one or more exemplary embodiments of the inventive concept, a pad electrode structure having good reliability, a flat display apparatus including the same, and a method of manufacturing the flat display apparatus are provided.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various suitable changes in form and details may be made therein without departing from the spirit and scope as defined by the following claims, and equivalents thereof.

What is claimed is:

1. A pad electrode structure comprising:
    a substrate;
    an insulating layer on the substrate;
    a pad electrode on a portion of the insulating layer; and
    an organic insulating layer on the pad electrode and having an opening exposing an upper surface of the pad electrode,
    wherein an insertion area is in the insulating layer and filled with the organic insulating layer,
    wherein the organic insulating layer in the insertion area is contacted with the substrate, and
    wherein the organic insulating layer is separated from an end portion of the substrate.

2. The pad electrode structure of claim 1, wherein the organic insulating layer comprises a first area on the pad electrode, a second area on the insulating layer, and a third area in the insertion area.

3. The pad electrode structure of claim 2, wherein a minimum height of the third area with respect to an upper surface of the insulating layer is greater than 0 and is smaller than a minimum height of the second area with respect to an upper surface of the insulating layer.

4. The pad electrode structure of claim 2, wherein a slope of a top of the third area with respect to an upper surface of the insulating layer is greater than a gradient slope of a top of the second area with respect to an upper surface of the insulating layer.

5. The pad electrode structure of claim 1, wherein a depth of the insertion area is less than or equal to a thickness of the insulating layer.

6. The pad electrode structure of claim 1, wherein the insulating layer comprises an inorganic insulating material different from a material of the organic insulating layer.

7. The pad electrode structure of claim 1, further comprising:

a main conductive bonding layer filling the opening of the organic insulating layer; and
a dummy conductive bonding layer contacting the organic insulating layer and the insulating layer.

8. The pad electrode structure of claim 7, further comprising a printed circuit board contacting the main conductive bonding layer.

9. A flat display apparatus comprising:
    a plurality of pixels; and
    a pad electrode structure electrically connected to the plurality of pixels,
    wherein the pad electrode structure comprises:
        a substrate;
        an insulating layer on the substrate;
        a pad electrode on a portion of the insulating layer; and
        an organic insulating layer on the pad electrode and having an opening exposing an upper surface of the pad electrode,
        wherein an insertion area is in the insulating layer and filled with the organic insulating layer, wherein the organic insulating layer in the insertion area is contacted with the substrate, and wherein the organic insulating layer is separated from an end portion of the substrate.

10. The flat display apparatus of claim 9, wherein the organic insulating layer comprises a first area on the pad electrode, a second area on the insulating layer, and a third area in the insertion area.

11. The flat display apparatus of claim 10, wherein a minimum height of the third area with respect to an upper surface of the insulating layer is greater than 0 and is less than a minimum height of the second area with respect to an upper surface of the insulating layer.

12. The flat display apparatus of claim 10, wherein a slope of a top of the third area with respect to an upper surface of the insulating layer is greater than a slope of a top of the second area with respect to an upper surface of the insulating layer.

13. The flat display apparatus of claim 9, wherein a depth of the insertion area is less than or equal to a thickness of the insulating layer.

14. The flat display apparatus of claim 9, wherein the insulating layer comprises an inorganic insulating material different from a material of the organic insulating layer.

15. The flat display apparatus of claim 9, further comprising:
    a main conductive bonding layer filling the opening of the organic insulating layer; and
    a dummy conductive bonding layer contacting the organic insulating layer and the insulating layer.

16. The flat display apparatus of claim 15, further comprising a printed circuit board contacting the main conductive bonding layer.

17. A method of manufacturing a flat display apparatus, the method comprising:
    forming an insulating layer on a substrate;
    forming an insertion area in the insulating layer, the insertion area being formed toward the substrate, and forming a pad electrode on the insulating layer; and
    forming an organic insulating layer to expose a portion of the pad electrode and a portion of the insulating layer,
    wherein, in the forming of the organic insulating layer, at least a portion of the organic insulating layer fills the insertion area, and
    wherein the organic insulating layer in the insertion area is contacted with the substrate.

18. The method of claim 17, further comprising spreading a conductive bonding material on the opening and arranging a printed circuit board (PCB) to contact the conductive bonding material,
  wherein, in the arranging of the PCB, the conductive bonding material is pressed by the PCB, thereby forming a main conductive bonding layer in the opening, and a dummy conductive bonding layer, the dummy conductive bonding layer contacting the insulating layer and the organic insulating layer.

* * * * *